United States Patent
Lim et al.

(10) Patent No.: US 11,936,233 B2
(45) Date of Patent: Mar. 19, 2024

(54) APPARATUS AND METHOD FOR CONTROLLING CHARGING OF SECONDARY BATTERY PACK

(71) Applicant: LG CHEM, LTD., Seoul (KR)

(72) Inventors: Jin-Hyung Lim, Daejeon (KR); Gi-Min Nam, Daejeon (KR); Kyu-Chul Lee, Daejeon (KR); Hyoung Jun Ahn, Daejeon (KR); Won-Tae Joe, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 444 days.

(21) Appl. No.: 17/280,799

(22) PCT Filed: Dec. 4, 2019

(86) PCT No.: PCT/KR2019/017030
§ 371 (c)(1),
(2) Date: Mar. 26, 2021

(87) PCT Pub. No.: WO2020/130430
PCT Pub. Date: Jun. 25, 2020

(65) Prior Publication Data
US 2022/0006314 A1  Jan. 6, 2022

(30) Foreign Application Priority Data
Dec. 18, 2018 (KR) .......... 10-2018-0164612

(51) Int. Cl.
*H02J 7/00* (2006.01)
*G01R 31/367* (2019.01)
*H01M 10/48* (2006.01)

(52) U.S. Cl.
CPC ...... *H02J 7/007186* (2020.01); *G01R 31/367* (2019.01); *H01M 10/48* (2013.01);
(Continued)

(58) Field of Classification Search
CPC .. H02J 7/007186; H02J 7/005; H02J 7/00714; H02J 7/007194; H02J 7/00;
(Continued)

(56) References Cited

U.S. PATENT DOCUMENTS 7,969,120 B2   6/2011  Plett
8,529,125 B2   9/2013  Leutheuser et al.
(Continued)

FOREIGN PATENT DOCUMENTS

CN   101103509 A   1/2008
CN   104541175 A   4/2015
(Continued)

OTHER PUBLICATIONS

International Search Report (with partial translation) and Written Opinion issued in corresponding International Patent Application No. PCT/KR2020/017030, dated Dec. 4, 2019.
(Continued)

*Primary Examiner* — Nha T Nguyen
(74) *Attorney, Agent, or Firm* — Morgan, Lewis & Bockius LLP

(57) ABSTRACT

A charging control apparatus measures a first temperature of a first secondary battery selected from the plurality of secondary batteries, a second temperature of a coolant flowing into the cooling device, a charging current of the secondary battery pack, a first terminal voltage of the first secondary battery and a second terminal voltage of a second secondary battery closest to the cooling device, estimates a temperature of a temperature estimation point of the second secondary battery from a lumped thermal model having a thermal resistance between two points selected from the temperature estimation point of the second secondary battery, the first temperature measurement point and the second temperature measurement point, and measurement data
(Continued)

about temperature, current and voltage, and determines the estimated temperature as a minimum temperature of the secondary battery pack, and varies a charging power provided to the secondary battery pack according to the minimum temperature.

15 Claims, 4 Drawing Sheets

(52) U.S. Cl.
CPC .......... *H02J 7/005* (2020.01); *H02J 7/00714* (2020.01); *H02J 7/007194* (2020.01)

(58) Field of Classification Search
CPC ... H02J 7/0047; G01R 31/367; G01R 31/387; H01M 10/48; H01M 10/443; H01M 10/486; H01M 10/613; H01M 10/6554; H01M 10/6556; Y02E 60/10
See application file for complete search history.

(56) References Cited

U.S. PATENT DOCUMENTS

| | | | |
|---|---|---|---|
| 8,977,510 B2 | 3/2015 | Ketkar et al. | |
| 9,912,181 B2 | 3/2018 | Gurries et al. | |
| 10,481,623 B1* | 11/2019 | Forouzan | G05B 13/048 |
| 2003/0118891 A1 | 6/2003 | Saito et al. | |
| 2007/0120537 A1 | 5/2007 | Yamamoto | |
| 2007/0298315 A1* | 12/2007 | Yamamoto | B60L 1/003 |
| | | | 429/62 |
| 2013/0158913 A1* | 6/2013 | Ketkar | B60L 58/25 |
| | | | 702/63 |
| 2014/0195179 A1* | 7/2014 | Guerin | H01M 10/486 |
| | | | 702/63 |
| 2014/0320087 A1 | 10/2014 | Takahashi | |
| 2014/0377605 A1 | 12/2014 | Debert et al. | |
| 2015/0084639 A1 | 3/2015 | Joe | |
| 2015/0280294 A1* | 10/2015 | Shin | B60L 58/26 |
| | | | 429/50 |
| 2017/0117725 A1* | 4/2017 | Hendricks | G01K 1/026 |
| 2017/0358933 A1* | 12/2017 | Becker | H01M 10/633 |
| 2018/0069272 A1 | 3/2018 | Seo et al. | |

FOREIGN PATENT DOCUMENTS

| | | |
|---|---|---|
| CN | 105206888 A | 12/2015 |
| EP | 3015835 B1 | 9/2018 |
| JP | 2005-265825 A | 9/2005 |
| JP | 2012-075281 A | 4/2012 |
| JP | 2013-118724 A | 6/2013 |
| JP | 2015-506073 A | 2/2015 |
| JP | 2016-167420 A | 9/2016 |
| JP | 2018-129130 A | 8/2018 |
| JP | 2018-147680 A | 9/2018 |
| KR | 10-2006-0107535 A | 10/2006 |
| KR | 10-2013-0082148 A | 7/2013 |
| KR | 10-2014-0062515 A | 5/2014 |
| WO | 2014/008278 A1 | 1/2014 |

OTHER PUBLICATIONS

Office Action dated Jan. 4, 2022 issued by the Japanese Patent Office for corresponding Japanese Patent Application No. 2020-562573.
Extended European Search Report dated May 7, 2021, issued in corresponding European Patent Application No. 19900131.4.
Office Action dated Jul. 12, 2023, issued in corresponding Chinese Patent Application No. 201980037089.X.
Wang, et al., "Research of dynamic thermal model for lithium battery pack used in hybrid electrical vehicle", Chinese Journal of Power Sources, 2017, vol. 41, No. 9, pp. 1341-1345 (with English Abstract and bibliographic data) (6 pages).
Walid Allafi, et al., "A Lumped Thermal Model of Lithium-Ion Battery Cells Considering Radiative Heat Transfer", Oct. 2018, Applied Thermal Engineering, vol. 143, 21 pages total.
Xinfan Lin, et al., "A lumped-parameter electro-thermal model for cylindrical batteries", 2014, Journal of Power Sources, vol. 257, pp. 1-11 (11 pages total).

* cited by examiner

APPARATUS AND METHOD FOR CONTROLLING CHARGING OF SECONDARY BATTERY PACK

TECHNICAL FIELD

The present application claims priority to Korean Patent Application No. 10-2018-0164612 filed on Dec. 18, 2018 in the Republic of Korea, the disclosures of which are incorporated herein by reference.

The present disclosure relates to an apparatus and method for reliably estimating a minimum temperature for an entire area of a secondary battery pack with a simple hardware configuration and controlling a charging condition of the secondary battery pack based on the estimated minimum temperature.

BACKGROUND ART

Recently, secondary batteries that can be repeatedly charged and regenerated are attracting attention as an alternative to fossil energy.

Secondary batteries are commonly used in traditional handheld devices such as mobile phones, video cameras and power tools, and more recently, its application field is gradually increasing to electric-driven vehicles (EVs, HEVs, PHEVs), large-capacity power storages (ESS), uninterruptible power supply systems (UPS), or the like. Commercialized secondary batteries include nickel cadmium batteries, nickel hydrogen batteries, nickel zinc batteries, and lithium secondary batteries. Among them, lithium secondary batteries are in the spotlight due to their advantages such as substantially no memory effect, low self-discharge rate and high energy density compared to nickel-based secondary batteries.

The secondary battery is used in various fields, and in the field of electric vehicles or power storage devices, which have recently attracted attention, a battery with a large capacity is required. Thus, in the corresponding field, a secondary battery pack in which a plurality of secondary batteries are connected in series and/or in parallel is used.

During the charging process of the secondary battery pack, heat is generated from a plurality of secondary batteries. The heat comes from the internal resistance of the secondary batteries. The heat generated from each secondary battery is conducted to adjacent secondary batteries or other components, or is discharged to the outside through a cooling device of an air-cooling type or a water-cooling type, which is coupled to the secondary battery pack.

When charging the secondary battery, working ions (e.g., lithium ions) move from a positive electrode to a negative electrode. In addition, the working ions transferred to the negative electrode are intercalated by diffusing into the negative electrode active material.

The rate of the electrochemical reaction accompanying the charging process is proportional to the temperature. That is, the lower the temperature, the lower the rate of the electrochemical reaction. Therefore, when charging the secondary battery pack, it is necessary to control charging based on a secondary battery having the lowest temperature. If charging is controlled based on a secondary battery having a relatively high temperature, in a secondary battery having a relatively low temperature, working ions are diffused at a slow rate into the negative electrode active material, so the concentration of working ions present on the surface of the negative electrode active material may increase to the extent of causing Li plating.

As is well known, when Li plating occurs on the surface of the negative electrode active material, there is a problem in that the life of the secondary battery is rapidly shortened. In addition, the plated lithium causes an excessive side reaction under an overcharging condition, thereby causing a thermal runaway phenomenon.

The secondary battery pack does not have the same temperature across the entire area. This is because the heat generated in each secondary battery is not the same and the heat transfer rates to adjacent regions are not the same. Therefore, in order to figure out which secondary has the lowest temperature among the secondary batteries constituting the secondary battery pack, it is necessary to attach a temperature sensor to each secondary battery and monitor the temperature of each secondary battery in real time. This is a cause of increasing the manufacturing cost of the secondary battery pack.

In addition, the temperature measured by the temperature sensor attached to the secondary battery is a surface temperature at the point where the temperature sensor is attached. Therefore, the corresponding temperature cannot be regarded as representing the entire temperature of the secondary battery. This is because even in the case of an individual secondary battery, the temperature of the entire area thereof is not uniform.

Therefore, in the prior art, considering that there is a temperature deviation for each region of the secondary battery, a corrected temperature obtained by subtracting the minimum temperature deviation from the temperature measured by the temperature sensor is estimated as the temperature of the secondary battery. In addition, the charging condition of the secondary battery pack, namely the magnitudes of the charging current and charging voltage, is adjusted based on the minimum value among the plurality of corrected temperatures.

This method has been a cause of conservatively adjusting the charging condition even in a situation where there is no or very little temperature deviation for each region of the secondary battery. That is, since the temperature of the secondary battery is always estimated to be lower than the actual temperature, the magnitudes of the charging current and charging voltage are adjusted to be low as much. This is a factor that increases the charging time of the secondary battery pack.

Shortening the charging time is particularly important in the electric vehicle field, among the application fields of the secondary battery. This is because an electric vehicle can be conveniently used only when the charging time is short.

To shorten the charging time, various technical issues must be solved. Among them, reliable estimation of an actual temperature of a region with the lowest temperature among the entire region of the secondary battery pack is also recognized as one of the problems to be solved.

DISCLOSURE

Technical Problem

The present disclosure is designed to solve the problems of the related art, and therefore the present disclosure is directed to providing a charging control apparatus and method, which may shorten a charging time by estimating a minimum temperature for an entire area of a secondary battery pack to be closer to an actual temperature and adjusting a charging condition of the secondary battery pack based on the estimated minimum temperature.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for controlling charging of a secondary battery pack that includes a plurality of secondary batteries and is coupled to a cooling device, the apparatus comprising: a cell temperature measuring unit configured to measure a first temperature of a first secondary battery selected from the plurality of secondary batteries; a coolant temperature measuring unit configured to measure a second temperature of a coolant flowing into the cooling device; a current measuring unit configured to measure a charging current of the secondary battery pack; a voltage measuring unit configured to measure a first terminal voltage of the first secondary battery and a second terminal voltage of a second secondary battery closest to the cooling device; a minimum temperature estimating unit configured to estimate a third temperature of a temperature estimation point of the second secondary battery from a lumped thermal model having a thermal resistance between two points selected from the temperature estimation point of the second secondary battery, a measurement point of the first temperature (or, a first temperature measurement point) and a measurement point of the second temperature (or, a second temperature measurement point), and the first temperature, the second temperature, the charging current, the first terminal voltage and the second terminal voltage input from the cell temperature measuring unit, the coolant temperature measuring unit, the current measuring unit and the voltage measuring unit, and determine the estimated third temperature as a minimum temperature of the secondary battery pack; and a charging power adjusting unit configured to vary a charging power provided to the secondary battery pack according to the determined minimum temperature.

According to an embodiment, the lumped thermal model may include a first thermal resistance between the first temperature measurement point and the second temperature measurement point, a second thermal resistance between the first temperature measurement point and the temperature estimation point, and a third thermal resistance between the temperature estimation point and the second temperature measurement point, and the first thermal resistance, the second thermal resistance and the third thermal resistance may be connected in series to configure a closed loop circuit.

According to another embodiment, the minimum temperature estimating unit may be configured to estimate the third temperature ($T_{2,estimate}$) based on the third equation below derived from the first equation and the second equation below:

$$mC_p \frac{dT_{2,estimate}}{dt} = |V_2 - OCV_2||I_2| + \frac{T_1 - T_{2,estimate}}{R_{12}} - \frac{T_{2,estimate} - T_{coolant}}{R_{2,c}}$$

$$mC_p \frac{dT_1}{dt} = |V_1 - OCV_1||I_1| + \frac{T_1 - T_{2,estimate}}{R_{12}} - \frac{T_1 - T_{coolant}}{R_{1,c}}$$

-continued $$\frac{dT_{2,estimate}}{dt} = \frac{T_1}{1t} + \frac{|V_1 - OCV_1||I_1| + |V_2 - OCV_2||I_2| - \frac{T_1 - T_{coolant}}{R_{1,c}} - \frac{T_{2,estimate} - T_{cool}}{R_{2,c}}}{mC_p}$$

where m is mass of the first and second secondary batteries; $C_p$ is a specific heat at constant pressure of the first and second secondary batteries; $V_1$ and $OCV_1$ are terminal voltage and OCV (Open Circuit Voltage) of the first secondary battery; $V_2$ and $OCV_2$ are terminal voltage and OCV of the second secondary battery; $T_1$ is the first temperature of the first temperature measurement point, $T_{coolant}$ is the second temperature of the second temperature measurement point and $T_{2,estimate}$ is the third temperature of the temperature estimation point; and $R_{1,c}$ is a first thermal resistance between the first temperature measurement point and the second temperature measurement point, $R_{12}$ is a second thermal resistance between the first temperature measurement point and the temperature estimation point and $R_{2,c}$ is a third thermal resistance between the temperature estimation point and the second temperature measurement point.

Preferably, the minimum temperature estimating unit may be configured to determine SOC (State Of Charge, $SOC_1$) of the first secondary battery, and determine OCV (Open Circuit Voltage, $OCV_1$) corresponding to the SOC ($SOC_1$) of the first secondary battery with reference to a predefined correlation between SOC and OCV, and determine SOC ($SOC_2$) of the second secondary battery, and determine OCV ($OCV_2$) corresponding to the SOC ($SOC_2$) of the second secondary battery with reference to the predefined correlation between SOC and OCV.

Preferably, the charging power adjusting unit may be configured to receive the minimum temperature from the minimum temperature estimating unit, determine a charging current or charging voltage corresponding to the input minimum temperature with reference to a predefined correlation between a charging current or charging voltage of the secondary battery pack and a minimum temperature of the secondary battery pack, and provide a charging power to the secondary battery pack according to the determined charging current or charging voltage.

In an embodiment, the charging power adjusting unit may be configured to vary a charging current or charging voltage according to the minimum temperature of the secondary battery pack with reference to a look-up table defining a plurality of minimum temperatures for the temperature estimation point and a charging current or charging voltage corresponding to each minimum temperature.

Preferably, the minimum temperature estimating unit may be configured to determine SOH (State Of Health) of the first secondary battery and the second secondary battery, and vary the first thermal resistance, the second thermal resistance and the third thermal resistance according to the determined SOH.

In another aspect of the present disclosure, there is also provided a method for controlling charging of a secondary battery pack that includes a plurality of secondary batteries and is coupled to a cooling device, the method comprising: measuring a first temperature of a first secondary battery selected from the plurality of secondary batteries; measuring a second temperature of a coolant flowing into the cooling device; measuring a charging current of the secondary battery pack; measuring a first terminal voltage of the first secondary battery and a second terminal voltage of a second secondary battery closest to the cooling device; estimating a temperature of a temperature estimation point of the second secondary battery from a lumped thermal model having a thermal resistance between two points selected from the temperature estimation point of the second secondary battery, a measurement point of the first temperature (or, a first temperature measurement point) and a measurement point of the second temperature (or, a second temperature measurement point), and the first temperature, the second temperature, the charging current, the first terminal voltage and the second terminal voltage input from the cell temperature measuring unit, the coolant temperature measuring unit, the current measuring unit and the voltage measuring unit, and determining the estimated temperature as a minimum temperature of the secondary battery pack; and varying a charging power provided to the secondary battery pack according to the determined minimum temperature.

In still another aspect of the present disclosure, there is also provided an electric-driven device, comprising the apparatus for controlling charging of a secondary battery pack.

Advantageous Effects

According to an aspect of the present disclosure, the temperature of the secondary battery at a location where the temperature is expected to be the lowest may be reliably estimated only with a minimal number of temperature sensors by using a lumped thermal model.

According to another aspect of the present disclosure, since the charging power may be adjusted according to a secondary battery that is estimated to have the lowest temperature, it is possible to prevent Li plating at a negative electrode during charging, particularly during rapid charging.

According to still another aspect of the present disclosure, the charging power may be increased to the maximum that is acceptable by the secondary battery pack by reliably estimating the temperature of the secondary battery, which is expected to have the minimum temperature among the secondary batteries of the secondary battery pack, using a lumped thermal model and then adjusting the charging power. Therefore, since it is not necessary to adjust the charging power conservatively as in the prior art, the charging time may be shortened.

The present disclosure may have various effects other than the above, and other effects of the present disclosure may be understood from the following description and more clearly figured out by the embodiments of the present disclosure.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

In addition, in the present disclosure, if it is deemed that a detailed description of a related known structure or function may obscure the subject matter of the present disclosure, the detailed description thereof will be omitted.

Throughout the specification, when a portion is referred to as "comprising" or "including" any element, it means that the portion may include other elements further, without excluding other elements, unless specifically stated otherwise. Furthermore, the term "processor" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed therebetween.

In this specification, a secondary battery refers to one independent cell that includes a negative electrode terminal and a positive electrode terminal and is physically separable. For example, one pouch-type lithium polymer cell may be regarded as a secondary battery.

Figure 1:
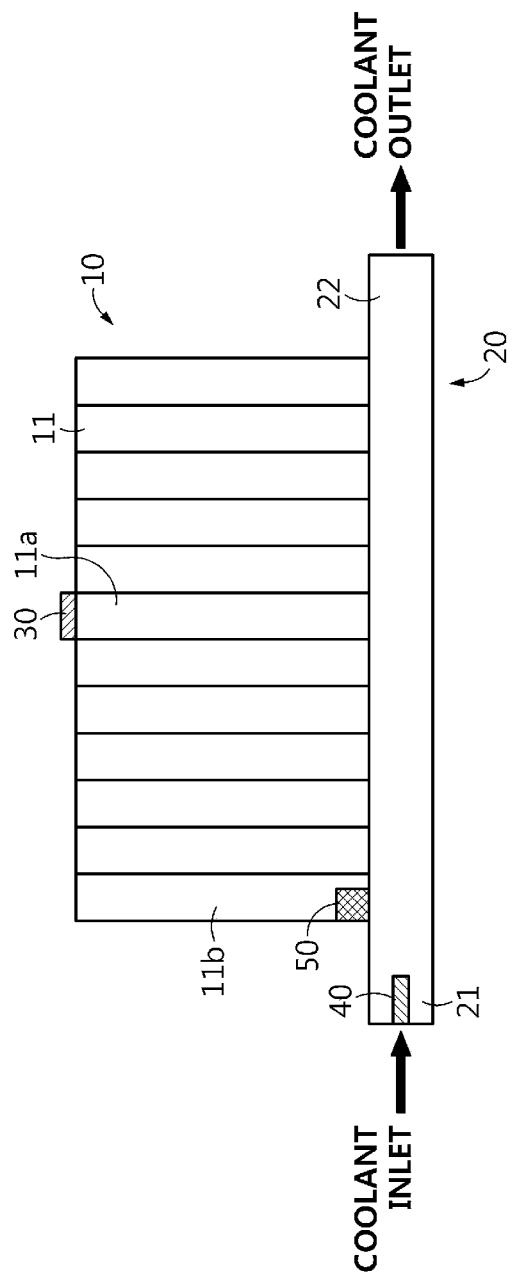
FIG. 1 is a diagram schematically showing a point at which a temperature is measured in a secondary battery pack to which a charging control apparatus according to an embodiment of the present disclosure is coupled.

FIG. 1 is a diagram schematically showing a point at which a temperature is measured in a secondary battery pack to which a charging control apparatus according to an embodiment of the present disclosure is coupled.

Referring to FIG. 1, a secondary battery pack 10 to which a charging control apparatus according to an embodiment of the present disclosure is coupled includes a plurality of secondary batteries 11 stacked in a predetermined direction. The stacking direction may be a vertical direction or a horizontal direction.

The secondary battery 11 may be of any kind as long as it is known in the art. For example, the secondary battery 11 may be a pouch-type lithium polymer secondary battery.

The secondary battery 11 may be stacked in various ways. Since the present disclosure is characterized by controlling charging of the secondary battery pack, the stacked structure of the secondary batteries 11 is not shown in detail.

Preferably, the secondary battery pack 10 is coupled to a cooling device 20. The cooling device 20 functions to absorb heat generated in the process of charging the plurality of secondary batteries 11 and release the heat to the outside.

In one embodiment, the cooling device 20 may be of an air-cooling type or water-cooling type. In this case, the cooling device 20 includes an inlet 21 through which coolant flows in and an outlet 22 through which coolant flows out.

In another embodiment, the cooling device 20 may be a cooling fin without a flow path for circulating air or liquid coolant.

Preferably, a cell temperature measuring unit 30 and a coolant temperature measuring unit 40 are installed to the secondary battery pack 10 and the cooling device 20, respectively.

The cell temperature measuring unit 30 is installed to a secondary battery randomly selected from the plurality of secondary batteries 10, and the coolant temperature measuring unit 40 is installed near the inlet 21 of the cooling device 20.

Preferably, the cell temperature measuring unit 30 is attached to a secondary battery 11 located in a region where temperature rises most due to the heat accumulation phenomenon, for example in the center of the secondary battery pack 10, in order to detect an overheating state of the secondary battery pack 10.

Hereinafter, for convenience of description, the secondary battery 11 to which the cell temperature measuring unit 30 is attached is referred to as a first secondary battery 11a. In addition, the secondary battery 11 located closest to the inlet 21 of the cooling device 20 is referred to as a second secondary battery 11b.

Meanwhile, when the secondary battery pack 10 is charged, heat is generated in each secondary battery 11. At this time, the temperature of the first secondary battery 11a located at the center is relatively higher than that of the second secondary battery 11b located at the side. In addition, the temperature of the second secondary battery 11b located at the inlet 21 of the cooling device 20 is lowest. This is because the second secondary battery 11b is located near the inlet 21 where the coolant having a low temperature flows in, and only one secondary battery 11 is located adjacently at the right, so that heat is discharged smoothly. Therefore, when controlling a charging power supplied to the secondary battery pack 10, it is preferable to control the charging power with reference to the temperature of the second secondary battery 11b.

In the present disclosure, a location where the temperature is expected to be lowest in the entire region of the second secondary battery 11b is selected as a temperature estimation point, and the temperature of the corresponding point is estimated using a lumped thermal model.

Preferably, the temperature estimation point of the second secondary battery 11b may be a lower end 50, but the present disclosure is not limited thereto. As an alternative, the temperature estimation point may be the center of an outer surface of the second secondary battery 11b that is in contact with air.

As shown in FIG. 1, when the secondary battery pack 10 and the cooling device 20 are coupled, since the lower end 50 of the second secondary battery 11b is located closest to the inlet 21 of the cooling device 20, heat is smoothly transferred to the cooling device 20, so that the temperature of the lower end 50 may be lower than that of other parts.

Figure 2:
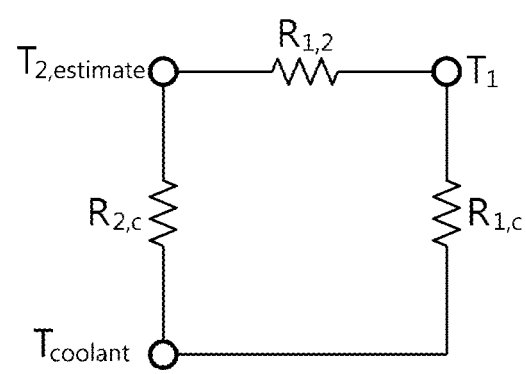
FIG. 2 is a diagram showing an example of a lumped thermal model according to an embodiment of the present disclosure.

FIG. 2 is a diagram showing an example of a lumped thermal model according to an embodiment of the present disclosure.

Referring to FIG. 2, the lumped thermal model according to an embodiment of the present disclosure includes first to third thermal resistances ($R_{1,2}$, $R_{1,c}$, $R_{2,c}$) connected in series on a closed loop circuit and first to third temperature nodes ($T_1$, $T_{2,estimate}$, $T_{coolant}$) provided between neighboring thermal resistances.

Here, the first thermal resistance ($R_{1,c}$) is a thermal resistance present between a first temperature measurement point of the cell temperature measuring unit 30 attached to the first secondary battery 11a and a second temperature measurement point of the coolant temperature measuring unit 40 attached to the inlet 21 of the cooling device 20.

In addition, the second thermal resistance ($R_{1,2}$) is a thermal resistance present between the first temperature measurement point and the temperature estimation point of the second secondary battery 11b.

In addition, the third thermal resistance ($R_{2,c}$) is a thermal resistance present between the temperature estimation point of the second secondary battery 11b and the second temperature measurement point.

In addition, the first temperature node ($T_1$) is a temperature measured by the cell temperature measuring unit 30.

In addition, the second temperature node ($T_{coolant}$) is a temperature measured by the coolant temperature measuring unit 40.

In addition, the third temperature node ($T_{2,estimate}$) is an estimated temperature for the temperature estimation point of the second secondary battery 11b.

According to the lumped thermal model, if the heat generation amount of an object having a mass m and a specific heat of $C_p$ at constant pressure is defined $Q_{dissipation}$ and the amount of heat transferred to or absorbed from an external object is defined as $Q_{convection}$, Equation (1) below is established.

If the target object absorbs heat from an external object, the sign of $Q_{convection}$ is changed to positive.

$$mC_p \frac{dT}{dt} = Q_{dissipation} - Q_{convection} \tag{1}$$

When the secondary battery pack 10 is charged, a terminal voltage V of each secondary battery 11 may be expressed as the sum of OCV (Open Circuit Voltage) and IR voltage according to internal resistance (R) as shown in Equation (2) below. I is a charging current flowing through the secondary battery 11.

$$V = OCV + IR \tag{2}$$

In addition, when the charging current I flows to each secondary battery 11, the heat generation amount $Q_{dissipation}$ of the secondary battery 11 may be represented by Equation (3) below.

$$Q_{dissipation} = I^2 R = |V - OCV||I| \tag{3}$$

In addition, according to the lumped thermal model, the amount of heat transferred from an object with a high temperature to an object with a low temperature may be represented by Equation (4) below.

$$Q_{convection} = \frac{T_{high} - T_{low}}{R_{h,l}} \tag{4}$$

In Equation 4, $T_{high}$ represents the temperature of an object with a high temperature, and $T_{low}$ represents the temperature of an object with a low temperature. Also, $R_{h,l}$ represents the thermal resistance existing between the object with a high temperature and the object with a low temperature.

If Equations (3) and (4) are applied to the first temperature node ($T_1$) of the lumped thermal model according to an embodiment of the present disclosure, Equation (5) below may be induced.

$$mC_p \frac{dT_1}{dt} = |V_1 - OCV_1||I_1| - \frac{T_1 - T_{2,estimate}}{R_{12}} - \frac{T_1 - T_{coolant}}{R_{1,c}} \quad (5)$$

In Equation (5), the first formula at the right term is a heat generation amount of the first secondary battery 11a generated during a predetermined time (dt), the second formula is an amount of heat transferred from the first secondary battery 11a with a high temperature to the second secondary battery 11b with a low temperature during the predetermined time (dt), and the third formula is an amount of heat transferred from the first secondary battery 11a with a high temperature to the cooling device 20 with a low temperature during the predetermined time (dt). $V_1$ and $OCV_1$ are terminal voltage and OCV of the first secondary battery 11a, and $I_1$ is a charging current of the first secondary battery 11a. $R_{12}$ is a thermal resistance between the temperature measurement point of the first secondary battery 11a and the temperature estimation point of the second secondary battery 11b, and $R_{1,c}$ is a thermal resistance between the temperature measurement point of the first secondary battery 11a and a coolant temperature measurement point. In addition, $T_1$ is a temperature measured by the cell temperature measuring unit 30, $T_{coolant}$ is a temperature measured by the coolant temperature measuring unit 40, and $T_{2,estimate}$ is an estimated temperature of the temperature estimation point of the second secondary battery 11b.

In addition, if Equations (3) and (4) are applied to the third temperature node ($T_{2,estimate}$) of the lumped thermal model according to an embodiment of the present disclosure, Equation (6) below may be derived.

$$mC_p \frac{dT_{2,estimate}}{dt} = |V_2 - OCV_2||I_2| - \frac{T_1 - T_{2,estimate}}{R_{12}} - \frac{T_{2,estimate} - T_{coolant}}{R_{2,c}} \quad (6)$$

In Equation (6), the first formula at the right term is a heat generation amount of the second secondary battery 11b generated during the predetermined time (dt), the second formula is an amount of heat transferred from the first secondary battery 11a with a high temperature to the second secondary battery 11b with a low temperature during the predetermined time (dt), and the third formula is an amount of heat transferred from the second secondary battery 11b with a high temperature to the cooling device 20 with a low temperature during the predetermined time (dt). $V_2$ and $OCV_2$ are terminal voltage and OCV of the second secondary battery 11b, and 12 is a charging current of the second secondary battery 11b. $R_{12}$ is a thermal resistance between the temperature measurement point of the first secondary battery 11a and the temperature estimation point of the second secondary battery 11b, and $R_{2,c}$ is a thermal resistance between the temperature estimation point of the second secondary battery 11b and the coolant temperature measurement point. In addition, $T_1$ is a temperature measured by the cell temperature measuring unit 30, $T_{coolant}$ is a temperature measured by the coolant temperature measuring unit 40, and $T_{2,estimate}$ is an estimated temperature of the temperature estimation point of the second secondary battery 11b.

In Equations (5) and (6), the second formulas at the right term are the same but have opposite signs. Therefore, if Equations (5) and (6) are added, Equation (7) below may be derived.

$$\frac{dT_{2,estimate}}{dt} = -\frac{dT_1}{dt} + \frac{|V_1 - OCV_1||I_1| + |V_2 - OCV_2||I_2| - \frac{T_1 - T_{coolant}}{R_{1,c}} - \frac{T_{2,estimate} - T_{coolant}}{R_{2,c}}}{mC_p} \quad (7)$$

In Equation (7), $T_1$ and $T_{coolant}$ are temperatures measured by the cell temperature measuring unit 30 and the coolant temperature measuring unit 40, respectively, $R_{1,c}$ and $R_{2,c}$ are predefined thermal resistances, and m and $C_p$ may are be approximated as mass of the secondary battery 11 constituting the secondary battery pack 10 and a specific heat at constant pressure. That is, it may be approximated that all secondary batteries 11 constituting the secondary battery pack 10, including the first and second secondary batteries 11a, 11b, have the same mass and the same specific heat at constant pressure. In addition, since the charging currents of the first secondary battery 11a and the second secondary battery 11b are the same, $I_1$ and $I_2$ may be replaced with the charging current (I) of the secondary battery pack 10.

Equation (7) may be transformed to Equation (8) below according to a time-discrete model.

$$T_{2,estimate}(k) = T_{2,estimate}(k-1) - [T_1(k) - T_1(k-1)] + \frac{(|V_1(k-1) - OCV_1(k-1)||I_1(k-1)| + |V_2(k-1) - OCV_2(k-1)||I_2(k-1)|)}{(mC_p)} - \frac{\frac{T_1(k-1) - T_{coolant}(k-1)}{R_{1,c}} - \frac{T_{2,estimate}(k-1) - T_{coolant}(k-1)}{R_{2,c}}}{mC_p} \quad (8)$$

In Equation (8), variables indexed with k are values measured or estimated at the current time point, and variables indexed with k−1 are values measured or estimated at the previous time point. $I_1$ and $I_2$ are the charging currents of the first secondary battery 11a and the second secondary battery 11b, which are the same as the charging current (I) of the secondary battery pack 10.

In Equation (8), the initial condition of $T_{2,estimate}$ may be set equal to the temperature of the first secondary battery 11a firstly measured by the cell temperature measuring unit 30 or set as low as a preset predetermined %.

Preferably, in the present disclosure, $V_1$, $V_2$, $OCV_1$, $OCV_2$, I, $T_1$, and $T_{coolant}$ may be determined at regular time intervals, and the temperature ($T_{2,estimate}$) for the temperature estimation point of the second secondary battery 11b may be estimated using preset parameter values ($R_{1,c}$, $R_{2,c}$, m, $C_p$) and Equation (8), and the estimated temperature may be determined as a minimum temperature ($T_{min}$) of the secondary battery pack 10. In addition, in the present disclosure, the charging power supplied to the secondary battery pack 10 may be controlled by adjusting the charging current and/or charging voltage for the secondary battery pack 10 according to the minimum temperature ($T_{min}$). This will be described later.

In the present disclosure, the thermal resistance corresponds to a temperature difference between two points when a unit heat amount (for example, 1 J) is transferred per one second through a structure existing between two points, and the unit is K (kelvin)/W (watt).

Preferably, the thermal resistance may be measured according to the standard measurement method defined in ASTM D5470.

As an example, the thermal resistance $R_{A,B}$ for two points A and B may be determined in the following way.

First, a heater is attached to the point A and a cooler is attached to the point B, so that the point A maintains the temperature of $T_A$ and the point B maintains the temperature of $T_B$ to form a temperature gradient $\Delta$ between the point A and the point B.

If the temperature gradient $\Delta$ is formed, the heat source is removed at the point A and the point B is maintained at the temperature of $T_B$ using the cooler. Then, the temperature at the point A is lowered exponentially from $T_A$ and is converged to $T_B$. In this process, a temperature change curve $T_{A,measure}(t)$ for time t at the point A is obtained.

Meanwhile, the temperature change at the point A may be approximated using the lumped thermal model as follows.

$$mC_p * dT_A(t)/dt = -1/R_{A,B}(T_A(t)-T_B) \quad (9)$$

$$dT_A(t)/dt = -1/(R_{A,B} * mC_p) * (T_A(t)-T_B) \quad (10)$$

$$d(T_A(t)-T_B)/dt = -1/(R_{A,B} * mC_p) * (T_A(t)-T_B) \quad (11)$$

If the differential equation of the Equation 11 is solved, Equation (12) below is obtained.

$$T_A(t) = \exp[-1/(R_{A,B} * mC_p) * (T_A(t)-T_B)] + T_B \quad (12)$$

In Equation (12), m is the mass of a structure existing between the point A and the point B, and $C_p$ is a specific heat at constant pressure, which may be known in advance. Therefore, it is possible to tune $R_{A,B}$ so that $T_A(t)$ of Equation (12) follows the temperature change curve $T_{A,measure}(t)$ obtained through experiments, and the tuned $R_{A,B}$ value is the thermal resistance between the point A and the point B.

Hereinafter, an apparatus and method for controlling charging of a secondary battery pack according to the present disclosure will be described in detail based on the above explanation.

Figure 3:
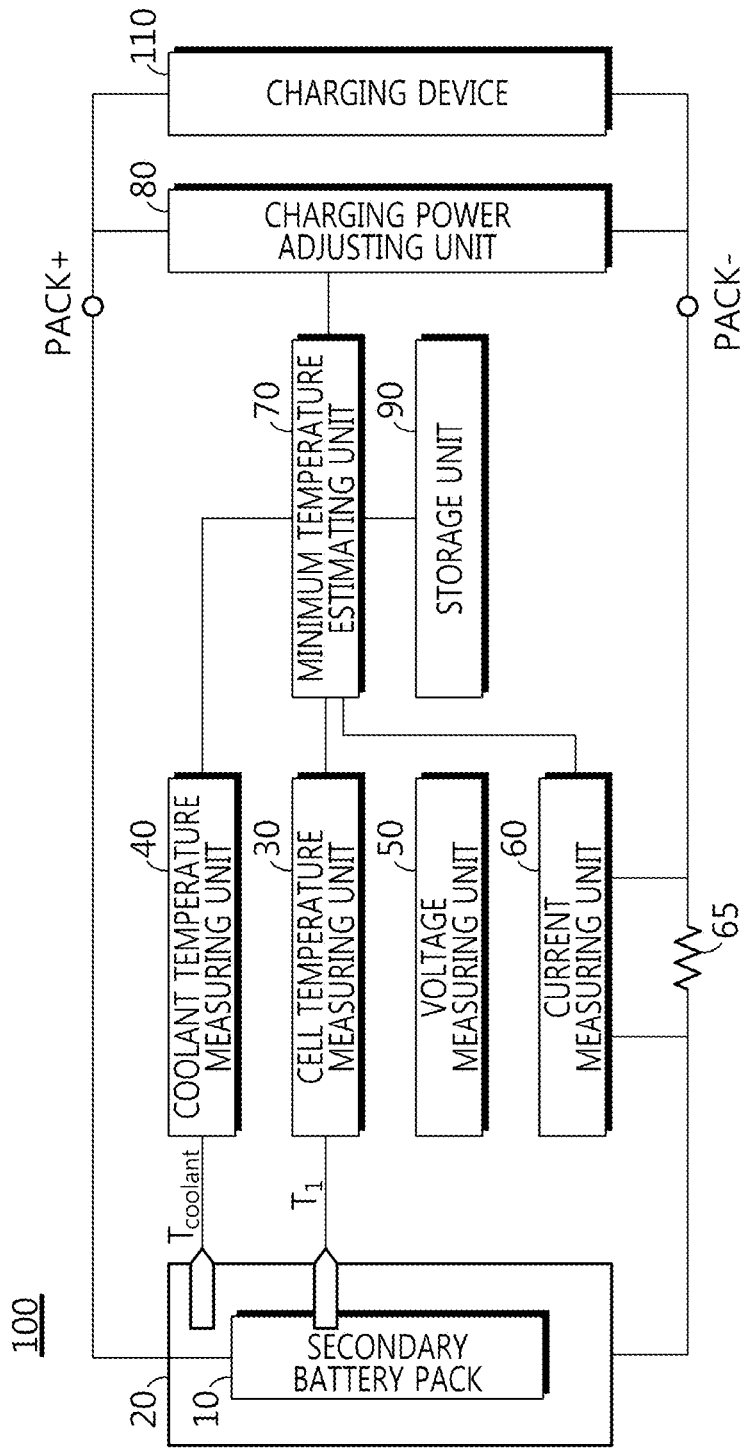
FIG. 3 is a block diagram showing an apparatus for controlling charging of a secondary battery pack according to an embodiment of the present disclosure.

FIG. 3 is a block diagram showing an apparatus for controlling charging of a secondary battery pack according to an embodiment of the present disclosure.

Referring to FIGS. 1 and 3 together, the apparatus 100 for controlling charging of a secondary battery pack according to an embodiment of the present disclosure is for controlling a charging power of the secondary battery pack 10 coupled to the cooling device 20, and includes a cell temperature measuring unit 30, a coolant temperature measuring unit 40, a voltage measuring unit 50, a current measuring unit 60, a minimum temperature estimating unit 70, a charging power adjusting unit 80 and a storage unit 90.

The cell temperature measuring unit 20 periodically measures the first temperature ($T_1$) of the first secondary battery 11a selected from the plurality of secondary batteries 10 according to the request of the minimum temperature estimating unit 70, and outputs the first temperature ($T_1$) measurement value to the minimum temperature estimating unit 70.

The coolant temperature measuring unit 30 periodically measures the second temperature ($T_{coolant}$) of the coolant flowing into the cooling device 20 according to the request of the minimum temperature estimating unit 70 and outputs the second temperature ($T_{coolant}$) measurement value to the minimum temperature estimating unit 70.

The cell temperature measuring unit 30 and the coolant temperature measuring unit 40 may be a temperature sensor known in the art, such as a thermocouple, and the present disclosure is not limited thereto.

The voltage measuring unit 50 periodically measures terminal voltages of the secondary batteries 1 constituting the secondary battery pack 10 according to the request of the minimum temperature estimating unit 70 and outputs the terminal voltage measurement value to the minimum temperature estimating unit 70.

For convenience of explanation, among the terminal voltages measured by the voltage measuring unit 50, the terminal voltage of the first secondary battery 11a is referred to as a first terminal voltage ($V_1$), and the terminal voltage of the second secondary battery 11b is referred to as a second terminal voltage ($V_2$).

The voltage measuring unit 50 may include a multiplexer for switching a voltage sensing line to measure the terminal voltage of each secondary battery 10 in a time-division manner, a floating capacitor for charging and holding the voltage of each secondary battery 10, a voltage sensing circuit for measuring the voltage of the secondary battery 10 that is charged and held by the floating capacitor, and the like, but the present disclosure is not limited thereto.

The current measuring unit 60 periodically measures a charging current (I) flowing to the secondary battery pack 10 according to the request of the minimum temperature estimating unit 70 and outputs the current measurement value to the minimum temperature estimating unit 70.

When the charging current (I) flows to the secondary battery pack 10, the current measuring unit 60 may measure a voltage applied to both ends of the sense resistor 65 and output the measured voltage value to the minimum temperature estimating unit 70. The both-end voltage of the sense resistor 65 corresponds to the current measurement value. The minimum temperature estimating unit 70 may convert the both-end voltage of the sense resistor 65 into a charging current using Ohm's law (V=IR). The current measuring unit 60 may also be replaced with other known current sensors such as a Hall sensor.

The minimum temperature estimating unit 70 is operably coupled to the cell temperature measuring unit 30, the coolant temperature measuring unit 40, the voltage measuring unit 50 and the current measuring unit 60. In addition, the minimum temperature estimating unit 70 periodically receives the first temperature ($T_1$) measurement value of the first secondary battery 11a, the second temperature ($T_{coolant}$) measurement value of the coolant, terminal voltage measurement values of all secondary batteries 11 including the first terminal voltage ($V_1$) measurement value and the second terminal voltage ($V_2$) measurement value of the first and second secondary batteries 11a, 11b, and the charging current (I) measurement value flowing to the secondary battery pack 10 from the cell temperature measuring unit 30, the coolant temperature measuring unit 40, the voltage measuring unit 50 and the current measuring unit 60, converts the values into digital data, and record the digital data in the storage unit 90.

The storage unit 90 is a storage medium capable of recording and erasing data electrically, magnetically, optically or quantum mechanically. The storage unit 90 may be a RAM, a ROM, a register, a hard disk, an optical recording medium, or a magnetic recording medium, without being limited thereto. The storage unit 90 may be electrically coupled operably to the minimum temperature estimating unit 70 thereby to be accessible by the minimum temperature estimating unit 70, for example, via a data bus.

The storage unit 90 may store and/or update and/or delete a program having various control logics executed by the minimum temperature estimating unit 70, and/or data generated when the control logics are executed. The storage unit 90 may be logically divided into two or more parts and may also be included in the minimum temperature estimating unit 70.

The minimum temperature estimating unit 70 may periodically estimate the first SOC ($SOC_1$) and the second SOC ($SOC_2$) of the first secondary battery 11a and the second secondary battery 11b, and determine the first OCV ($OCV_1$) and the second OCV ($OCV_2$) corresponding to each SOC.

As an example, the minimum temperature estimating unit 70 may estimate the first and second SOCs ($SOC_1$, $SOC_2$) of the first secondary battery 11a and the second secondary battery 11b by the ampere counting method, and determine the first and second OCVs ($OCV_1$, $OCV_2$) corresponding to the first and second SOCs ($SOC_1$, $SOC_2$).

Specifically, the minimum temperature estimating unit 70 controls the voltage measuring unit 50 immediately before charging of the secondary battery pack 10 starts, to measure the first terminal voltage ($V_1$) and the second terminal voltage ($V_2$) of the first secondary battery 11a and the second secondary battery 11b, and determines the first terminal voltage ($V_1$) and the second terminal voltage ($V_2$) as the first OCV ($OCV_1$) initial value and the second OCV ($OCV_2$) initial value of the first secondary battery 11a and the second secondary battery 11b.

After that, the minimum temperature estimating unit 70 determines the first SOC ($SOC_1$) initial value and the second SOC ($SOC_2$) initial value of the first secondary battery 11a and the second secondary battery 11b by reading the first and second SOCs ($SOC_1$, $SOC_2$) corresponding to the initial values of the first and second OCVs ($OCV_1$, $OCV_2$) from the SOC-OCV look-up table recorded in the storage unit 90 in advance.

Subsequently, if charging of the secondary battery pack 10 starts, the minimum temperature estimating unit 70 determines the first SOC ($SOC_1$) and the second SOC ($SOC_2$) of the first secondary battery 11a and the second secondary battery 11b by counting the charging current (I) periodically measured, and reads the first OCV ($OCV_1$) and the second OCV ($OCV_2$) corresponding to the first SOC ($SOC_1$) and the second SOC ($SOC_2$) with reference to the SOC-OCV look-up table to update the first OCV ($OCV_1$) and the second OCV ($OCV_2$) of first and second secondary batteries 11a, 11b and record them in the storage unit 90.

Alternatively, the minimum temperature estimating unit 70 may determine the first and second SOCs ($SOC_1$, $SOC_2$) of the first secondary battery 11a and the second secondary battery 11b using periodically measured current and voltage data by utilizing an adaptive algorithm such as the extended Kalman filter known in the art, and read the first OCV ($OCV_1$) and the second OCV ($OCV_2$) corresponding to the first SOC ($SOC_1$) and the second SOC ($SOC_2$) with reference to the SOC-OCV look-up table to update the first OCV ($OCV_1$) and the second OCV ($OCV_2$) of the second secondary batteries 11a, 11b and record them in the storage unit 90.

In the present disclosure, the minimum temperature estimating unit 70 may also determine the SOCs ($SOC_1$, $SOC_2$) of the first secondary battery 11a and the second secondary battery 11b using other methods known in the art in addition to the ampere counting method and the extended Kalman filter algorithm.

Preferably, the minimum temperature estimating unit 70 may estimate third temperature ($T_{2,estimate}$) for the temperature estimation point of the second secondary battery 11b by using Equation (8) above derived from the lumped thermal model (see FIG. 2) periodically, for example at every 1 second, whenever voltage, current and temperature data are collected, and determine the third temperature ($T_{2,estimate}$) as the minimum temperature ($T_{min}$) of the secondary battery pack 10. The minimum temperature estimating unit 70 records the determined minimum temperature ($T_{min}$) of the secondary battery pack 10 in the storage unit 90.

When determining the third temperature ($T_{2,estimate}$) by applying Equation (8), the minimum temperature estimating unit 70 may set the initial value of the third temperature ($T_{2,estimate}$) to be the same as the initial value ($T_1(1)$) of the first temperature ($T_1$) or to be lower than the initial value of the first temperature ($T_1$) as much as a predetermined %. In addition, the thermal resistance ($R_{1,c}$, $R_{2,c}$), the mass (m) of the secondary battery 11 and the specific heat ($C_p$) at constant pressure may refer to parameter data recorded in the storage unit 90 in advance.

The charging power adjusting unit 80 is operably coupled to the minimum temperature estimating unit 70 and may receive the minimum temperature ($T_{min}$) of the secondary battery pack 10 from the minimum temperature estimating unit 70 and adaptively vary the charging power provided to the secondary battery pack 10 according to the minimum temperature ($T_{min}$).

As an example, the charging power adjusting unit 80 may determine a charging current corresponding to the minimum temperature ($T_{min}$) with reference to a predefined correlation between the charging current of the secondary battery pack 10 and the minimum temperature ($T_{min}$) of the secondary battery pack 10, for example the minimum temperature-charging current look-up table, and provide the determined charging current to the secondary battery pack 10 by controlling the charging device 110.

Here, the charging mode may be a constant current charging mode in which the magnitude of the charging current is kept constant until the terminal voltage of the secondary battery 10 reaches a cutoff voltage, but the present disclosure is not limited thereto.

As another example, the charging power adjusting unit 80 may determine a charging voltage corresponding to the minimum temperature ($T_{min}$) with reference to a predefined correlation between the charging voltage of the secondary battery pack 10 and the minimum temperature ($T_{min}$) of the secondary battery pack 10, for example the minimum temperature-charging voltage look-up table, and provide the determined charging voltage to the secondary battery pack 10 by controlling the charging device 110.

Here, the charging mode may be a constant voltage charging mode in which the magnitude of the charging voltage is kept constant until the terminal voltage of the secondary battery 10 reaches a full charge voltage, but the present disclosure is not limited thereto.

The charging power adjusting unit 80 may supply the charging power to the secondary battery pack 10 according to a pulse charging mode, in addition to the constant current charging mode and the constant voltage charging mode. In this case, the charging power adjusting unit 80 may adaptively vary the amplitude, duration and duty ratio of the charging pulse according to the minimum temperature ($T_{min}$) of the secondary battery pack 10.

Meanwhile, the minimum temperature estimating unit 70 may determine SOH (State Of Health) of the first secondary battery 11a and the second secondary battery 11b, and vary the first thermal resistance ($R_{1,2}$), the second thermal resistance ($R_{1,c}$) and the third thermal resistance ($R_{2,c}$) according to the determined SOH.

Specifically, the minimum temperature estimating unit 70 may calculate an I-V linear equation for each of the first secondary battery 11a and the second secondary battery 11 by a least square method by using a plurality of voltage data and current data accumulated in the storage unit 90, and determine the slope of each I-V linear equation as internal resistance of the first secondary battery 11a and the second secondary battery 11b. In addition, the minimum temperature estimating unit 70 may determine an increase rate % of the internal resistance based on the initial internal resistance of the first secondary battery 11a and the initial internal resistance of the second secondary battery 11b recorded in the storage unit 90 in advance, and determine (100%—increase rate) as the SOH. After that, the minimum temperature estimating unit 70 may vary the first thermal resistance ($R_{1,2}$), the second thermal resistance ($R_{1,c}$) and the third thermal resistance ($R_{2,c}$) according to the current SOH by reading the first thermal resistance ($R_{1,2}$), the second thermal resistance ($R_{1,c}$) and the third thermal resistance ($R_{2,c}$) corresponding to the SOC with reference to a look-up table defining the correlation of the first thermal resistance ($R_{1,2}$), the second thermal resistance ($R_{1,c}$) and the third thermal resistance ($R_{2,c}$) according to the SOH of the secondary battery 10.

Since the present disclosure is not limited by the method of calculating the degree of degradation (SOH), it is obvious that the degree of degradation may be calculated using other methods known in the technical field to which the present disclosure belongs, in addition to the method of calculating the degree of degradation using internal resistance.

According to one aspect, the minimum temperature estimating unit 70 may be implemented as a micro control unit (MCU) including a microprocessor. In this embodiment, the minimum temperature estimating unit 70 may optionally include a processor known in the art to execute the control logic described above, an application-specific integrated circuit (ASIC), another chipset, a logic circuit, a register, a communication modem, a memory device, a data processing device, or the like.

In addition, the control logic described above may be coded into a program executable in the MCU unit, stored in a storage medium accessible by the processor of the MCU unit and executed therefrom. If the storage unit 90 is integrated in the MCU unit, it is not restricted that the program is recorded in the storage unit 90.

The storage medium is not particularly limited as long as it is accessible by a processor included in a computer. As an example, the storage medium includes at least one selected from the group consisting of a ROM, a RAM, a register, a CD-ROM, a magnetic tape, a hard disk, a floppy disk and an optical data recording device.

The code scheme may be modulated into a carrier signal to be included in a communication carrier at a particular point in time, and also distributed to a networked computer to be stored and executed therein. In addition, functional programs, codes and code segments for implementing the combined control logics may be easily inferred by programmers in the art to which the present disclosure belongs.

According to another aspect, the charging power adjusting unit 80 controls the charging device 110, and may be a control unit provided in the charging device 110. In this case, the minimum temperature estimating unit 70 and the charging power adjusting unit 80 may be connected through a communication interface, and the minimum temperature estimating unit 70 may transmit the minimum temperature ($T_{min}$) of the secondary battery pack 10 to the charging power adjusting unit 80 through the communication interface.

Preferably, the communication interface may be a wired communication interface such as a CANN communication interface, an RS232 communication interface, or the like, or a short-range wireless communication interface such as Zigbee, Bluetooth, Wi-Fi, or the like.

The apparatus for controlling charging of a secondary battery pack according to an embodiment of the present disclosure may be included in an electric-driven device.

The electric-driven device includes various devices receiving power from a secondary battery pack, such as smart phones, tablet PCs, laptop computers, electric vehicles, hybrid vehicles, plug hybrid vehicles, electric bicycles, drones, power storage devices, uninterruptible power supplies, or the like.

In addition, the apparatus for controlling charging of a secondary battery pack according to the present disclosure may be included in a battery management system for controlling charging and discharging of the secondary battery pack.

Figure 4:
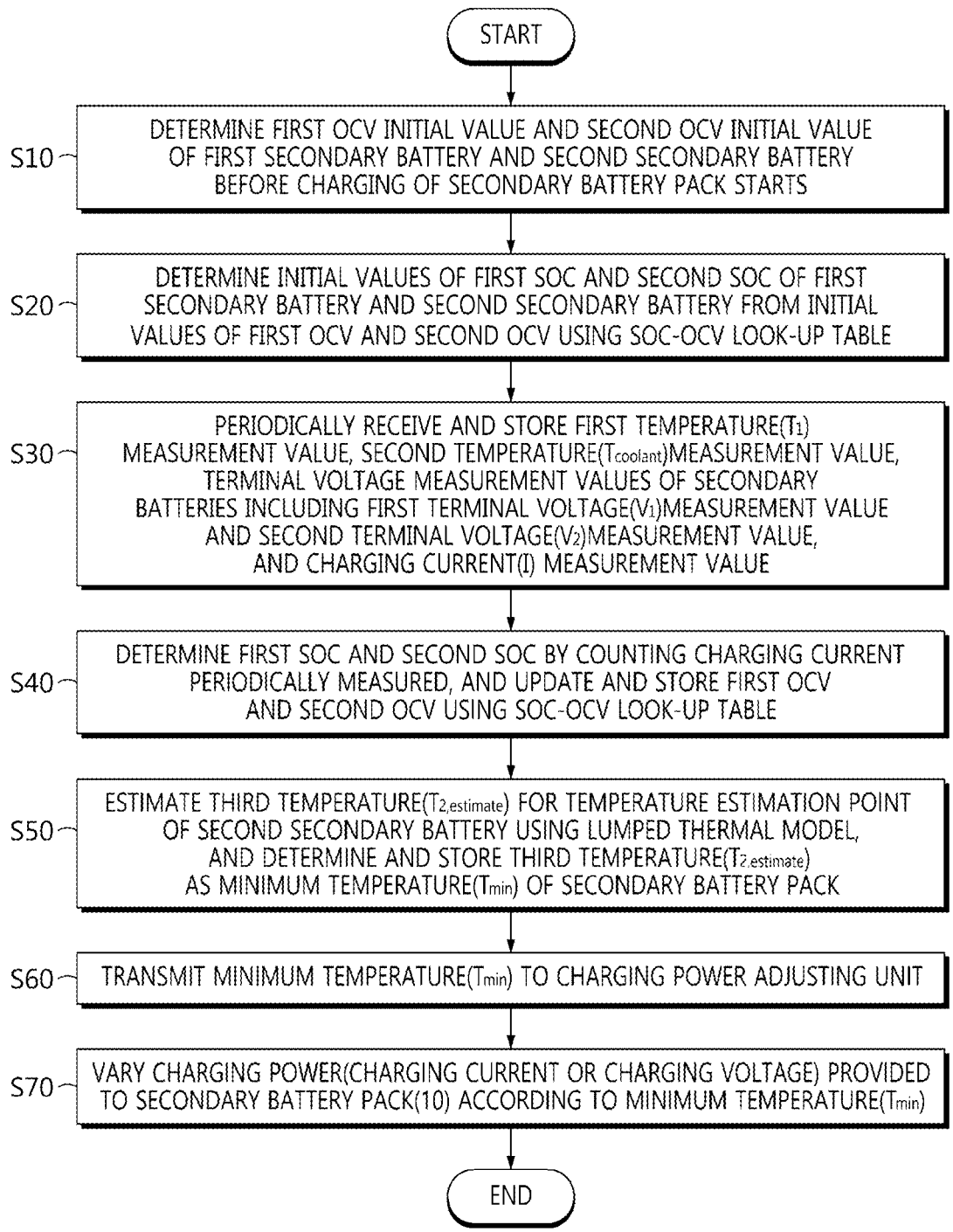
FIG. 4 is a flowchart for illustrating a method for controlling charging of a secondary battery pack according to an embodiment of the present disclosure.

FIG. 4 is a flowchart for illustrating a method for controlling charging of a secondary battery pack according to an embodiment of the present disclosure.

Hereinafter, a method for controlling charging of a secondary battery pack according to an embodiment of the present disclosure will be described with reference to FIG. 4.

First, in Step S10, the minimum temperature estimating unit 70 controls the voltage measuring unit 50 before charging of the secondary battery pack 10 starts, to measure the first terminal voltage ($V_1$) and the second terminal voltage ($V_2$) of the first secondary battery 11a and the second secondary battery 11b and determine the first terminal voltage ($V_1$) and the second terminal voltage ($V_2$) as a first OCV ($OCV_1$) initial value and a second OCV ($OCV_2$) initial value of the first secondary battery 11a and the second secondary battery 11b.

Subsequently, in Step S20, the minimum temperature estimating unit 70 determines initial values of the first SOC ($SOC_1$) and the second SOC ($SOC_2$) of the first secondary battery 11a and the second secondary battery 11b by reading the first and second SOCs ($SOC_1$, $SOC_2$) corresponding to the initial values of the first and second OCVs ($OCV_1$, $OCV_2$) from the SOC-OCV look-up table recorded in the storage unit 90 in advance.

After that, in Step S30, if the charging of the secondary battery pack 10 starts, the minimum temperature estimating unit 70 controls the cell temperature measuring unit 30, the coolant temperature measuring unit 40, the voltage measuring unit 50 and the current measuring unit 60 to periodically receive the first temperature ($T_1$) measurement value of the first secondary battery 11a, the second temperature ($T_{coolant}$) measurement value of the inlet 21 of the cooling device 20, the terminal voltage measurement value of the secondary batteries 11 including the measurement value of the first terminal voltage ($V_1$) of the first secondary battery 11a and the measurement value of the second terminal voltage ($V_2$) of the second secondary battery 11b, and the charging current (I) measurement value of the secondary battery pack 10 corresponding to the charging current flowing in the first and second secondary batteries 11a, 11b, and recording the measurement values in the storage unit 90.

In Step S40, the minimum temperature estimating unit 70 determines the first SOC ($SOC_1$) and the second SOC ($SOC_2$) of the first secondary battery 11a and the second secondary battery 11b by counting the charging current (I) periodically measured based on the initial value of the first SOC ($SOC_1$) and the initial value of the second SOC ($SOC_2$) determined in Step S10, updates the first OCV ($OCV_1$) and the second OCV ($OCV_2$) of the first and second secondary batteries 11a, 11b by reading the first OCV ($OCV_1$) and the second OCV ($OCV_2$) corresponding to the first SOC ($SOC_1$) and the second SOC ($SOC_2$) with reference to the SOC-OCV look-up table, and stores the updated data in the storage unit 90.

Here, it is obvious that the minimum temperature estimating unit 70 may determine SOCs ($SOC_1$, $SOC_2$) of the first secondary battery 11a and the second secondary battery 11b using an extended Kalman filter algorithm or other methods known in the art in addition to the ampere counting method.

Next, in Step S50, the minimum temperature estimating unit 70 may estimate the third temperature ($T_{2,estimate}$) for the temperature estimation point of the second secondary battery 11b by using Equation (8) above derived from the lumped thermal model (see FIG. 2) periodically, for example at every 1 second, whenever voltage, current and temperature data are collected, and determine the third temperature ($T_{2,estimate}$) as the minimum temperature ($T_{min}$) of the secondary battery pack 10. The minimum temperature estimating unit 70 records the determined minimum temperature ($T_{min}$) of the secondary battery pack 10 in the storage unit 90.

When determining the third temperature ($T_{2,estimate}$) by applying Equation (8), the minimum temperature estimating unit 70 may set the initial value of the third temperature ($T_{2,estimate}$) to be the same as the initial value of the first temperature ($T_1$) or to be lower than the initial value of the first temperature ($T_1$) as much as a predetermined %. In addition, the thermal resistance ($R_{1,c}$, $R_{2,c}$), the mass (m) of the secondary battery 11 and the specific heat ($C_p$) at constant pressure may refer to parameter data recorded in the storage unit 90 in advance.

Next, in Step S60, the minimum temperature estimating unit 70 transmits the minimum temperature ($T_{min}$) of the secondary battery pack 10 determined in Step S50 to the charging power adjusting unit 80.

Then, in Step S70, the charging power adjusting unit 80 may receive the minimum temperature ($T_{min}$) of the secondary battery pack 10 from the minimum temperature estimating unit 70 and adaptively vary the charging power provided to the secondary battery pack 10 according to the minimum temperature ($T_{min}$).

As an example, the charging power adjusting unit 80 may determine a charging current corresponding to the minimum temperature ($T_{min}$) with reference to a predefined correlation between the charging current of the secondary battery pack 10 and the minimum temperature ($T_{min}$) of the secondary battery pack 10, for example the minimum temperature-charging current look-up table, and provide the determined charging current to the secondary battery pack 10 by controlling the charging device 110.

Here, the charging mode may be a constant current charging mode in which the magnitude of the charging current is kept constant until the terminal voltage of the secondary battery 10 reaches a cutoff voltage, but the present disclosure is not limited thereto.

As another example, the charging power adjusting unit 80 may determine a charging voltage corresponding to the minimum temperature ($T_{min}$) with reference to a predefined correlation between the charging voltage of the secondary battery pack 10 and the minimum temperature ($T_{min}$) of the secondary battery pack 10, for example the minimum temperature-charging voltage look-up table, and provide the determined charging voltage to the secondary battery pack 10 by controlling the charging device 110.

Here, the charging mode may be a constant voltage charging mode in which the magnitude of the charging voltage is kept constant until the terminal voltage of the secondary battery 10 reaches a full charge voltage, but the present disclosure is not limited thereto.

The charging power adjusting unit 80 may supply the charging power to the secondary battery pack 10 according to a pulse charging mode, in addition to the constant current charging mode and the constant voltage charging mode. In this case, the charging power adjusting unit 80 may adaptively vary the amplitude, duration and duty ratio of the charging pulse according to the minimum temperature ($T_{min}$) of the secondary battery pack 10.

Meanwhile, the minimum temperature estimating unit 70 may determine SOH of the first secondary battery 11a and the second secondary battery 11b as described above, and vary the first thermal resistance ($R_{1,2}$), the second thermal resistance ($R_{1,c}$) and the third thermal resistance ($R_{2,c}$) according to the determined SOH.

In the description of the various exemplary embodiments of the present disclosure, it should be understood that the element referred to as 'unit' is distinguished functionally rather than physically. Therefore, each element may be selectively integrated with other elements or each element may be divided into sub-elements for effective implementation control logic(s). However, it is obvious to those skilled in the art that, if functional identity can be acknowledged for the integrated or divided elements, the integrated or divided elements fall within the scope of the present disclosure.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

INDUSTRIAL APPLICABILITY

According to an aspect of the present disclosure, the temperature of the secondary battery at a location where the temperature is expected to be the lowest may be reliably estimated only with a minimal number of temperature sensors by using a lumped thermal model.

According to another aspect of the present disclosure, since the charging power may be adjusted according to a secondary battery that is estimated to have the lowest temperature, it is possible to prevent Li plating at a negative electrode during charging, particularly during rapid charging.

According to still another aspect of the present disclosure, the charging power may be increased to the maximum that is acceptable by the secondary battery pack by reliably estimating the temperature of the secondary battery, which is expected to have the minimum temperature among the secondary batteries of the secondary battery pack, using a lumped thermal model and then adjusting the charging power. Therefore, since it is not necessary to adjust the charging power conservatively as in the prior art, the charging time may be shortened.

What is claimed is:

1. An apparatus for controlling charging of a secondary battery pack that includes a plurality of secondary batteries and is coupled to a cooling device, the apparatus comprising:
a cell temperature measuring unit configured to measure a first temperature of a first secondary battery selected from the plurality of secondary batteries;
a coolant temperature measuring unit configured to measure a second temperature of a coolant flowing into the cooling device;
a current measuring unit configured to measure a charging current of the secondary battery pack;
a voltage measuring unit configured to measure a first terminal voltage of the first secondary battery and a second terminal voltage of a second secondary battery closest to the cooling device;
a minimum temperature estimating unit configured to:
estimate a third temperature of a temperature estimation point of the second secondary battery from a lumped thermal model having a thermal resistance between two points selected from the temperature estimation point of the second secondary battery, a measurement point of the first temperature ("first temperature measurement point") and a measurement point of the second temperature ("second temperature measurement point"), and the first temperature, the second temperature, the charging current, the first terminal voltage, and the second terminal voltage input from the cell temperature measuring unit, the coolant temperature measuring unit, the current measuring unit, and the voltage measuring unit, and
determine the estimated third temperature as a minimum temperature of the secondary battery pack; and
a charging power adjusting unit configured to vary a charging power provided to the secondary battery pack according to the determined minimum temperature.

2. The apparatus for controlling charging of the secondary battery pack according to claim 1,
wherein the lumped thermal model includes a first thermal resistance between the first temperature measurement point and the second temperature measurement point, a second thermal resistance between the first temperature measurement point and the temperature estimation point, and a third thermal resistance between the temperature estimation point and the second temperature measurement point, and
the first thermal resistance, the second thermal resistance and the third thermal resistance are connected in series to configure a closed loop circuit.

3. The apparatus for controlling charging of the secondary battery pack according to claim 1,
wherein the minimum temperature estimating unit is configured to estimate the third temperature ($T_{2,estimate}$) based on a third equation below derived from a first equation and a second equation below:

$$mC_p \frac{dT_{2,estimate}}{dt} = |V_2 - OCV_2||I_2| + \frac{T_1 - T_{2,estimate}}{R_{12}} - \frac{T_{2,estimate} - T_{coolant}}{R_{2,c}}$$

$$mC_p \frac{dT_1}{dt} = |V_1 - OCV_1||I_1| - \frac{T_1 - T_{2,estimate}}{R_{12}} - \frac{T_1 - T_{coolant}}{R_{1,c}}$$

-continued $$\frac{dT_{2,estimate}}{dt} = -\frac{dT_1}{dt} + \frac{|V_1 - OCV_1||I_1| + |V_2 - OCV_2||I_2| - \frac{T_1 - T_{coolant}}{R_{1,c}} - \frac{T_{2,estimate} - T_{coolant}}{R_{2,c}}}{mC_p}$$

where m is a mass of the first and second secondary batteries; $C_p$ is a specific heat at constant pressure of the first and second secondary batteries; $V_1$ and $OCV_1$ are a terminal voltage and an open circuit voltage ("OCV") of the first secondary battery; $V_2$ and $OCV_2$ are a terminal voltage and an OCV of the second secondary battery; $T_1$ is the first temperature of the first temperature measurement point, $T_{coolant}$ is the second temperature of the second temperature measurement point, and $T_{2,estimate}$ is the third temperature of the temperature estimation point; $R_{1,c}$ is a first thermal resistance between the first temperature measurement point and the second temperature measurement point, $R_{12}$ is a second thermal resistance between the first temperature measurement point and the temperature estimation point, and $R_{2,c}$ is a third thermal resistance between the temperature estimation point and the second temperature measurement point and $I_1$ and $I_2$ are charging currents of the first and second secondary batteries, respectively.

4. The apparatus for controlling charging of the secondary battery pack according to claim 3,
wherein the minimum temperature estimating unit is configured to:
determine a state of charge ($SOC_1$) of the first secondary battery, and determine an open circuit voltage ($OCV_1$) corresponding to the $SOC_1$ with reference to a predefined correlation between SOC and OCV, and determine a state of charge ($SOC_2$) of the second secondary battery, and determine an open circuit voltage ($OCV_2$) corresponding to the $SOC_2$ with reference to the predefined correlation between SOC and OCV.

5. The apparatus for controlling charging of the secondary battery pack according to claim 1,
wherein the charging power adjusting unit is configured to receive the minimum temperature from the minimum temperature estimating unit, determine a charging current or a charging voltage corresponding to the input minimum temperature with reference to a predefined correlation between a charging current or a charging voltage of the secondary battery pack and a minimum temperature of the secondary battery pack, and provide a charging power to the secondary battery pack according to the determined charging current or charging voltage.

6. The apparatus for controlling charging of the secondary battery pack according to claim 1,
wherein the charging power adjusting unit is configured to vary a charging current or a charging voltage according to the minimum temperature of the secondary battery pack with reference to a look-up table defining a plurality of minimum temperatures for the temperature estimation point and a charging current or a charging voltage corresponding to each minimum temperature.

7. The apparatus for controlling charging of the secondary battery pack according to claim 2,
wherein the minimum temperature estimating unit is configured to determine a state of health (SOH) of the first secondary battery and the second secondary battery, and vary the first thermal resistance, the second thermal resistance, and the third thermal resistance according to the determined SOH.

8. A method for controlling charging of a secondary battery pack that includes a plurality of secondary batteries and is coupled to a cooling device, the method comprising:
measuring a first temperature of a first secondary battery selected from the plurality of secondary batteries;
measuring a second temperature of a coolant flowing into the cooling device;
measuring a charging current of the secondary battery pack;
measuring a first terminal voltage of the first secondary battery and a second terminal voltage of a second secondary battery closest to the cooling device;
estimating a third temperature of a temperature estimation point of the second secondary battery from a lumped thermal model having a thermal resistance between two points selected from the temperature estimation point of the second secondary battery, a measurement point of the first temperature ("first temperature measurement point") and a measurement point of the second temperature ("second temperature measurement point"), and the first temperature, the second temperature, the charging current, the first terminal voltage and the second terminal voltage input from the cell temperature measuring unit, the coolant temperature measuring unit, the current measuring unit, and the voltage measuring unit, and determining the estimated third temperature as a minimum temperature of the secondary battery pack; and
varying a charging power provided to the secondary battery pack according to the determined minimum temperature.

9. The method for controlling charging of the secondary battery pack according to claim 8,
wherein the lumped thermal model includes a first thermal resistance between the first temperature measurement point and the second temperature measurement point, a second thermal resistance between the first temperature measurement point and the temperature estimation point, and a third thermal resistance between the temperature estimation point and the second temperature measurement point, and
the first thermal resistance, the second thermal resistance and the third thermal resistance are connected in series to configure a closed loop circuit.

10. The method for controlling charging of the secondary battery pack according to claim 8,
wherein the step of determining a minimum temperature of the secondary battery pack is configured to estimate the third temperature ($T_{2,estimate}$) based on a third equation below derived from a first equation and a second equation below:

$$mC_p \frac{dT_{2,estimate}}{dt} = |V_2 - OCV_2||I_2| + \frac{T_1 - T_{2,estimate}}{R_{12}} - \frac{T_{2,estimate} - T_{coolant}}{R_{2,c}}$$

$$mC_p \frac{dT_1}{dt} = |V_1 - OCV_1||I_1| - \frac{T_1 - T_{2,estimate}}{R_{12}} - \frac{T_1 - T_{coolant}}{R_{1,c}}$$

$$\frac{dT_{2,estimate}}{dt} = -\frac{dT_1}{dt} +$$

$$\frac{|V_1 - OCV_1||I_1| + |V_2 - OCV_2||I_2| - \frac{T_1 - T_{coolant}}{R_{1,c}} - \frac{T_{2,estimate} - T_{coolant}}{R_{2,c}}}{mC_p}$$

where m is a mass of the first and second secondary batteries; $C_p$ is a specific heat at constant pressure of the first and second secondary batteries; $V_1$ and $OCV_1$ are a terminal voltage and an open circuit voltage ("OCV") of the first secondary battery; $V_2$ and $OCV_2$ are a terminal voltage and an OCV of the second secondary battery; $T_1$ is the first temperature of the first temperature measurement point, $T_{coolant}$ is the second temperature of the second temperature measurement point, and $T_{2,estimate}$ is the third temperature of the temperature estimation point; $R_{1,c}$ is a first thermal resistance between the first temperature measurement point and the second temperature measurement point, $R_{12}$ is a second thermal resistance between the first temperature measurement point and the temperature estimation point and $R_{2,c}$ is a third thermal resistance between the temperature estimation point and the second temperature measurement point and $I_1$ and $I_2$ are charging currents of the first and second secondary batteries, respectively.

11. The method for controlling charging of the secondary battery pack according to claim 10,
wherein the step of determining a minimum temperature of the secondary battery pack further includes:
determining a state of charge ($SOC_1$) of the first secondary battery, and determining an open circuit voltage ($OCV_1$) corresponding to the $SOC_1$ with reference to a predefined correlation between SOC and OCV, and
determining a state of charge ($SOC_2$) of the second secondary battery, and determine an open circuit voltage ($OCV_2$) corresponding to the $SOC_2$ with reference to the predefined correlation between SOC and OCV.

12. The method for controlling charging of the secondary battery pack according to claim 8,
wherein the step of varying a charging power provided to the secondary battery pack includes:
determining a charging current or a charging voltage corresponding to the determined minimum temperature with reference to a predefined correlation between a charging current or a charging voltage of the secondary battery pack and a minimum temperature of the secondary battery pack, and providing a charging power to the secondary battery pack according to the determined charging current or charging voltage.

13. The method for controlling charging of the secondary battery pack according to claim 12,
wherein the step of varying a charging power provided to the secondary battery pack includes:
varying a charging current or a charging voltage according to the third temperature ($T_{2,estimate}$) with reference to a look-up table defining a plurality of minimum temperatures for the temperature estimation point and a charging current or a charging voltage corresponding to each minimum temperature.

14. The method for controlling charging of the secondary battery pack according to claim 9,
wherein the step of determining a minimum temperature of the secondary battery pack further includes:
determining a state of health (SOH) of the first secondary battery and the second secondary battery, and varying the first thermal resistance, the second thermal resistance, and the third thermal resistance according to the determined SOH.

15. An electric-driven device, comprising the apparatus for controlling charging of the secondary battery pack according to claim 1.

\* \* \* \* \*